United States Patent [19]

Nakase

[11] Patent Number: 5,574,687
[45] Date of Patent: Nov. 12, 1996

[54] SEMICONDUCTOR MEMORY

[75] Inventor: Yasunobu Nakase, Hyogo, Japan

[73] Assignee: Mitsubishi Denki Kabushiki Kaisha, Tokyo, Japan

[21] Appl. No.: 533,550

[22] Filed: Sep. 25, 1995

[30]     Foreign Application Priority Data

Jun. 26, 1995  [JP]  Japan .................................. 7-159442

[51] Int. Cl.$^6$ ...................................................... G11C 7/00
[52] U.S. Cl. ............................... 365/189.06; 365/189.11; 365/190; 365/202; 365/203
[58] Field of Search ............................... 365/189.06, 190, 365/189.11, 202, 203

[56]                 References Cited

U.S. PATENT DOCUMENTS

| | | | |
|---|---|---|---|
| 4,730,279 | 3/1988 | Ohtani ..................................... | 365/203 |
| 5,068,830 | 11/1991 | Plants et al. ............................. | 365/190 |
| 5,119,335 | 6/1992 | Nozaki .................................... | 365/190 |
| 5,309,401 | 5/1994 | Suzuki et al. ............................ | 365/203 |

FOREIGN PATENT DOCUMENTS 0118369   9/1981   Japan ................. 365/189.06

OTHER PUBLICATIONS

1993 IEEE International Solid–State Circuits Conference Tech. Papers, pp. 242–243, Feb. 26, 1993, Larry R. Fenstermaker, et al., "A Low–Power Generator–Based FIFO Using Ring Pointers and Current–Mode Sensing".

1990 Symposium on VLSI Circuits Digest of Technical Papers, pp. 115–116, Kunio Uchiyama, et al., "Architecture and Design of a Second–Level Cache Chip with Copy–Back and 160MB/s Burst–Transfer Features".

*Primary Examiner*—Son T. Dinh
*Attorney, Agent, or Firm*—Oblon, Spivak, McClelland, Maier & Neustadt, P.C.

[57]                 ABSTRACT

There is disclosed a rapidly and correctly readable semiconductor device wherein a clamping transistor (Pcr_0) having a threshold voltage (Vthp) precharges a pair of bit lines (BIT_0, BIT_1) at a precharge potential (VDD–|Vthp|) when transistors (Pprc_0, Pprc_1) are conducting, and a write circuit (3) includes a clamping transistor (Pcr_1) having the same threshold voltage (Vthp) as the clamping transistor (Pcr_0), and inverters (23, 24) responsive to input data (DIN_0, DIN_1) for outputting signals which are "H" at the precharge potential (VDD–|Vthp|) and "L" at the ground potential to a pair of write input lines (WD_0, WD_1), respectively.

13 Claims, 8 Drawing Sheets

SEMICONDUCTOR MEMORY

BACKGROUND OF THE INVENTION

1. Field of the Invention

The present invention relates to a semiconductor memory including read and write circuits, such as a semiconductor static RAM.

2. Description of the Background Art

FIG. 7 is a circuit diagram of a conventional synchronous semiconductor static memory (referred to hereinafter as an SRAM for simplification). For the purpose of illustration, a read circuit 4 for one memory cell portion 1 is shown as provided in FIG. 7. In practice, memory cells are arranged in the form of a matrix with rows each connected to a word line and columns each connected to a pair of bit lines.

In FIG. 7, the reference character PRC designates a precharge signal, and RD_EN designates a read bit line selection signal which is applied to the gates of PMOS gate transistors Pgt_0, pgt_1 connected between a read circuit 4 and a pair of bit lines BIT_0, BIT_1, respectively, to control the conduction/non-conduction of the gate transistors Pgt_0, Pgt_1. A sense signal SENSE controls the active/inactive state of the read circuit (sense amplifier) 4 which in turn detects a potential difference between the pair of bit lines BIT_0 and BIT_1 to provide output data DOUT.

FIG. 8 is a timing chart showing the read operation of the conventional SRAM of FIG. 7. The read operation from the memory cell portion 1 of the SRAM of FIG. 7 is described below with reference to FIG. 8. A power supply potential VDD is represented by "H", and a ground potential GND is represented by "L" hereinafter.

Prior to start of the read operation, the precharge signal PRC remains "L", and a precharge operation is executed in which PMOS transistors Pprc_0 to Pprc_3 are turned on to set the potentials of the pair of bit lines BIT_0, BIT_1 and a pair of read input lines SIN_0, SIN_1 to "H".

The read operation starts at the rising edge of a clock signal CLK to "H". A word line WORD rises to "H" at a time later than the rising edge of the clock signal CLK by the amount of time tw, to place the memory cell portion 1 into a selecting state. This delay is developed since a row decoder (not shown) for controlling word lines decodes a row address signal to select a desired word line.

The read bit line selection signal RD_EN falls to "L" at a time later than the rising edge of the clock signal CLK by the amount of time tr (substantially equal to the time tw) to turn on the gate transistors Pgt_0 and Pgt_1 for electrical connection between the pair of bit lines BIT_0, BIT_1 and the read input lines SIN_0, SIN_1 of the read circuit 4 (bit line selecting state). This delay is developed since a column decoder (not shown) for controlling bit lines decodes a column address signal to select a desired bit line. The precharge signal PRC becomes "H" in response to the bit line selection to complete the precharge operation.

A memory cell 10 in the memory cell portion 1 includes inverters 11 and 12 which establish a loop connection. It is assumed that a node NODE_0 at the output of the inverter 12 is "H", and a node NODE_1 at the output of the inverter 11 is "L".

In this state, when the word line WORD is selected to rise to "H", current flows from the bit line BIT_1 to the node NODE_1 through an NMOS access transistor Nmc_1 in the memory cell portion 1. This reduces the potential of the bit line BIT_1 from "H". In general, a bit line is connected to a multiplicity of memory cells and accordingly has a very large parasitic capacitance, and a memory cell designed to have a minimum size has a very small current driving capability. Thus, the potential drop rate is low during the time the electrical charge on the bit line is discharged only by the current flowing through one memory cell 10, or during the time between the rising edge of the word line WORD and the rising edge of the sense signal SENSE.

Since the node NODE_0 in the memory cell 10 is "H", no current flows to the access transistor Nmc_0, and the bit line BIT_0 is held at "H". The falling edge of the clock signal CLK triggers the sense signal SENSE to rise to "H". This allows a transistor. Nsa_2 in the read circuit 4 to conduct, activating a sense amplifier 20 including a cross-coupled connection of an inverter 21 consisting of a PMOS transistor Psa_0 and an NMOS transistor Nsa_0 and an inverter 22 consisting of a PMOS transistor Psa_1 and an NMOS transistor Nsa_1.

The potential of the bit line BIT_0 is propagated to the read input line SIN_0, and the potential of the bit line BIT_1 is propagated to the read input line SIN_1. The potential of the read input line SIN_0 is slightly higher than the potential of the read input line SIN_1 and, accordingly, the amount of current flowing through the NMOS transistor Nsa_0 of the inverter 21 is slightly greater than the amount of current flowing through the NMOS transistor Nsa_1 of the inverter 22. Then the potential of the read input line SIN_1 becomes lower to increase the amount of current flowing through the NMOS transistor Nsa_0. This is repeated, and finally the NMOS transistor Nsa_0 becomes completely conducting and the NMOS transistor Nsa_1 becomes completely non-conducting. The electrical charge on the read input line SIN_1 is discharged through the NMOS transistors Nsa_0 and Nsa_2 having a high current driving capability. Thus the potential of the bit line BIT_1 (read input line SIN_1) is rapidly reduced to "L". The potential of the read input line SIN_1 is outputted as the output data DOUT to the exterior through an inverter 13.

Since the falling edge of the clock signal CLK inactivates address lines, the word line WORD and bit line selection signal RD_EN reach a non-selecting state with a slight delay. The sense signal SENSE and the precharge signal fall to "L" in response to the transition of the bit line selection signal RD_EN to the non-selecting state to inactivate the sense amplifier 20. At the same time, the PMOS transistors Pprc_2 and Pprc_3 initialize the pair of read input lines SIN_0 and SIN_1 of the sense amplifier to "H", and the read operation is completed.

The conventional synchronous SRAM constructed as above described presents a drawback to be described below. The sense amplifier 20 in the read circuit 4 has a large gain, and a small potential difference between the pair of read input lines SIN_0 and SIN_1 is amplified to the power supply potential VDD or ground potential GND when outputted.

This results from a positive feedback function, that is, the state in which one of the NMOS transistors Nsa_0 and Nsa_1 carries more current than the other becomes more firmly fixed when the operation of the sense amplifier starts.

The sense amplifier 20 is not permitted to be activated for reasons of the large gain of the sense amplifier 20 before a sufficiently large potential difference is developed between the pair of bit lines (the pair of read input lines). This is because the setting of the active time period of the sense amplifier 20 earlier than necessary might cause the potential difference between the pair of bit lines not to reach a sensible magnitude due to the unbalanced transistor characteristics of the NMOS transistors Nsa_0 and Nsa_1 and noises on the bit lines, resulting in misjudgment at the start of the operation of the sense amplifier.

The misjudgment at the start of the operation of the sense amplifier is not corrected in some midpoint of the operation since the positive feedback function operates to fix the misjudgment. Thus, the sense amplifier 20 is not permitted to be activated before the potential difference between the pair of bit lines reaches a sensible level (about several hundreds of millivolts). A read time period T0 between the start of the SRAM operation and the provision of the output is expressed as:

$$T0 = tw + tb1 + tb2 \quad (1)$$

where tw is a time interval between the rising edge of the clock signal CLK and the rising edge of the word line WORD, tb1 is a time interval between the rising edge of the word line and the provision of the potential difference between desired bit lines, and tb2 is a time interval between activating the sense amplifier and the provision of its output.

As above stated, since the electrical charge on the bit line is discharged only by the small current of the memory cell during the time interval tb1, it takes much time for the sense amplifier 20 to increase the potential difference between the pair of bit lines to the sensible level, resulting in low-speed read operation.

SUMMARY OF THE INVENTION

According to a first aspect of the present invention, a semiconductor memory comprises: first and second power supplies for supplying first and second power supply voltages, respectively; a pair of first and second bit lines; a memory cell portion having first and second storage nodes for causing potentials at the first and second storage nodes to feed the first and second power supply voltages, respectively, on the basis of contents of storage; precharge means for setting the potentials of the first and second bit lines to a precharge potential during a precharge time period; memory cell portion connecting means for electrically connecting the first and second storage nodes of the memory cell portion and the pair of first and second bit lines, respectively, during a write time period or during a read time period which follows the precharge time period; read means for providing output data to the exterior during the read time period in response to a potential difference between first and second bit line potentials respectively appearing on the first and second bit lines; and write means for developing a potential difference between the first and second bit lines during the write time period in response to external input data, the potential difference permitting the contents of storage in the memory cell portion to be rewritten, the precharge means including a clamping transistor of a first conductivity type having a first electrode connected to the first power supply and control and second electrodes connected commonly, the clamping transistor having a first threshold voltage for shifting the first power supply voltage at its first electrode toward the second power supply voltage by the amount of the first threshold voltage to provide the precharge potential, the read means including first and second read transistors of the first conductivity type having the first threshold voltage and receiving the first and second bit line potentials at their control electrodes during the read time period, respectively, each of the first and second read transistors having a first electrode connected to the first power supply, each of the first and second read transistors being conducting when a potential difference between the control electrode and first electrode thereof is greater than the first threshold voltage and being non-conducting when the potential difference is less than the first threshold voltage, thereby determining the output data depending on the conduction/non-conduction thereof, the write means setting one of the pair of first and second bit lines to the precharge potential and the other bit line to the second power supply voltage in response to the input data.

Preferably, according to a second aspect of the present invention, the read means further includes a third read transistor of a second conductivity type having a first electrode connected to the second power supply, a second electrode connected to a second electrode of the first read transistor, and a control electrode connected to a second electrode of the second read transistor, the third read transistor having a second threshold voltage, and a fourth read transistor of the second conductivity type having a first electrode connected to the second power supply, a second electrode connected to the second electrode of the second read transistor, and a control electrode connected to the second electrode of the first read transistor, the fourth read transistor having the second threshold voltage, each of the third and fourth read transistors being conducting when a potential difference between the control electrode and first electrode thereof is greater than the second threshold voltage and being non-conducting when the potential difference is less than the second threshold voltage; and the first to fourth read transistors form a sense amplifier for providing output data, the output data from the sense amplifier being provided at the second electrode of at least one of the third and fourth read transistors.

Preferably, according to a third aspect of the present invention, the read means further includes first potential setting means connected to the second power supply for setting the potentials of the second electrodes of the third and fourth read transistors to the second power supply voltage during a first potential setting time period prior to the read time period.

Preferably, according to a fourth aspect of the present invention, the current driving capability of the first read transistor is greater than that of the third read transistor, and the current driving capability of the second read transistor is greater than that of the fourth read transistor.

Preferably, according to a fifth aspect of the present invention, the read means further includes second potential setting means connected to the first power supply for setting the potentials of the control electrodes of the first and second read transistors to the first power supply voltage during a second potential setting time period other than the read time period.

The precharge means of the semiconductor memory according to the first aspect of the present invention precharges the first and second bit lines at the precharge potential obtained by shifting the first power supply voltage toward the second power supply voltage by the amount of the first threshold voltage by using the clamping transistor of the first conductivity type having the first threshold voltage and including the first electrode connected to the first power supply and the second and control electrodes connected commonly.

In the read means, the potential difference between the control and first electrodes of the first and second read transistors of the first conductivity type having the first electrodes connected to the first power supply and the control electrodes receiving the first and second bit line potentials during the read time period is equal to the first threshold voltage after the precharge time period, and the first and second read transistors are placed into the boundary state between conduction and non-conduction.

During the read time period after the precharge time period, when the memory cell connecting means electrically connects the first and second storage nodes of the memory cell and the pair of first and second bit lines, one of the first and second bit line potentials is changed to the shift potential further shifted from the precharge potential toward the second power supply voltage in accordance with the contents of storage in the memory cell.

Additionally, the write means sets one of the first and second bit lines to the precharge potential and the other bit line to the second power supply voltage, thereby preventing the potentials of the first and second bit lines from shifting toward the first power supply voltage from the precharge potential immediately after the write operation.

Therefore, the clamping transistor of the precharge means can correctly set the first and second bit lines to the precharge potential during the precharge time period when the write operation, precharge operation and read operation are successively performed.

In the semiconductor memory according to the second aspect of the present invention, the sense amplifier includes four transistors: the third and fourth read transistors in addition to the above stated first and second read transistors.

Thus, the sense amplifier may be achieved by a relatively simple circuit arrangement including the four transistors. This provides the high-speed readable semiconductor memory without lowering the degree of integration.

The first potential setting means of the read means in the semiconductor memory according to the third aspect of the present invention sets the potentials of the second electrodes of the third and fourth read transistors to the second power supply voltage during the first potential setting time period prior to the read time period, ensuring the non-conducting state of the third and fourth read transistors at the start of the read time period.

In the semiconductor memory according to the fourth aspect of the present invention, the current driving capability of the first read transistor is greater than that of the third read transistor, and the current driving capability of the second read transistor is greater than that of the fourth read transistor. When the third and fourth read transistors might be placed into the conducting or non-conducting state by mistake, then the first and second read transistors normally operate to complement the malfunction of the third and fourth read transistors.

The second potential setting means of the read means in the semiconductor memory according to the fifth aspect of the present invention sets the potentials of the control electrodes of the first and second read transistors to the first power supply voltage during the second potential setting time period other than the read time period. Thus the potential difference between the control and first electrodes of the first and second read transistors is zero during the second potential setting time period.

It is therefore an object of the present invention to provide a rapidly and correctly readable semiconductor memory.

These and other objects, features, aspects and advantages of the present invention will become more apparent from the following detailed description of the present invention when taken in conjunction with the accompanying drawings.

DESCRIPTION OF THE PREFERRED EMBODIMENTS

<Structure>

Figure 1:
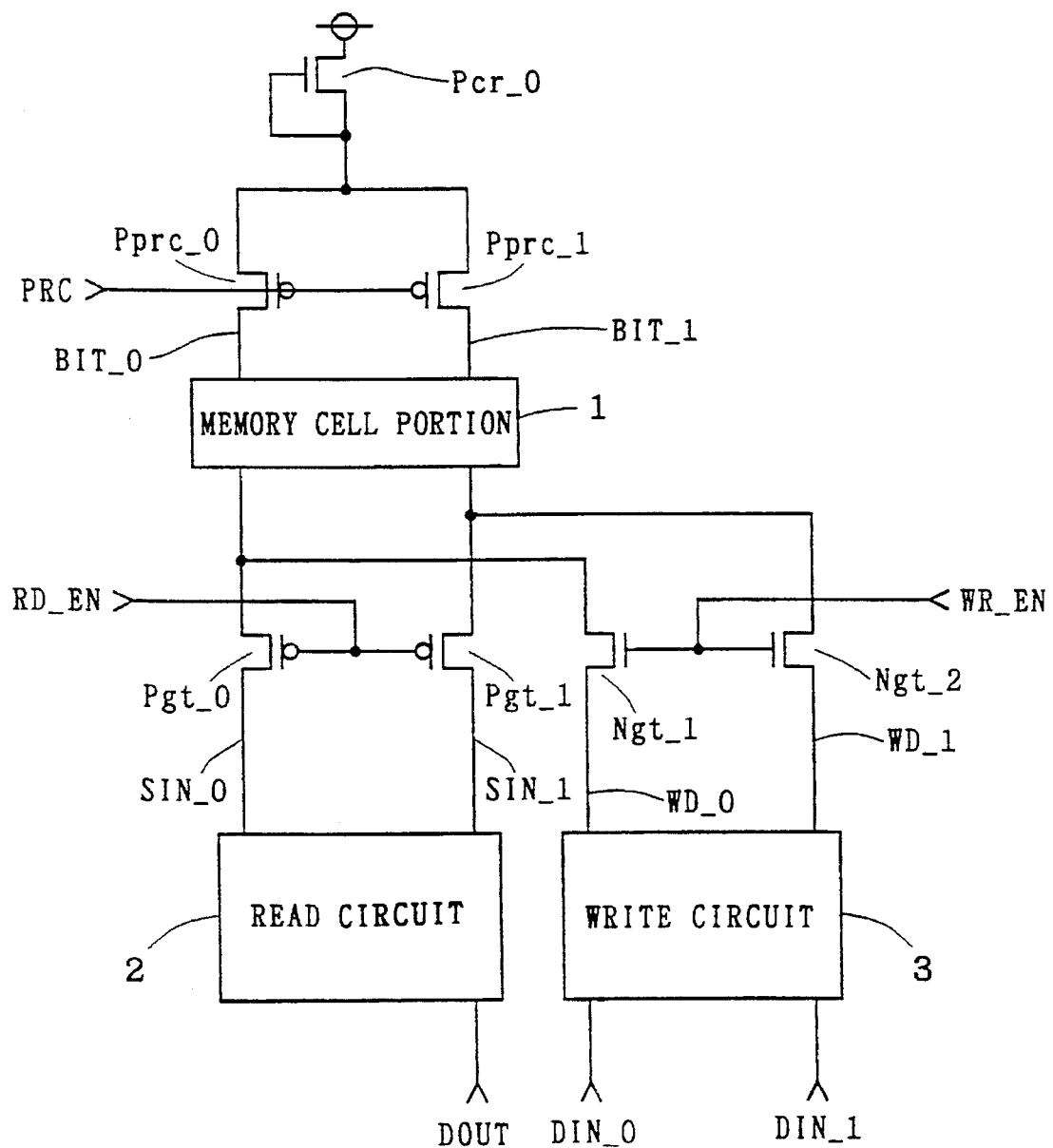
FIG. 1 illustrates an SRAM according to one preferred embodiment of the present invention.
Figure 2:
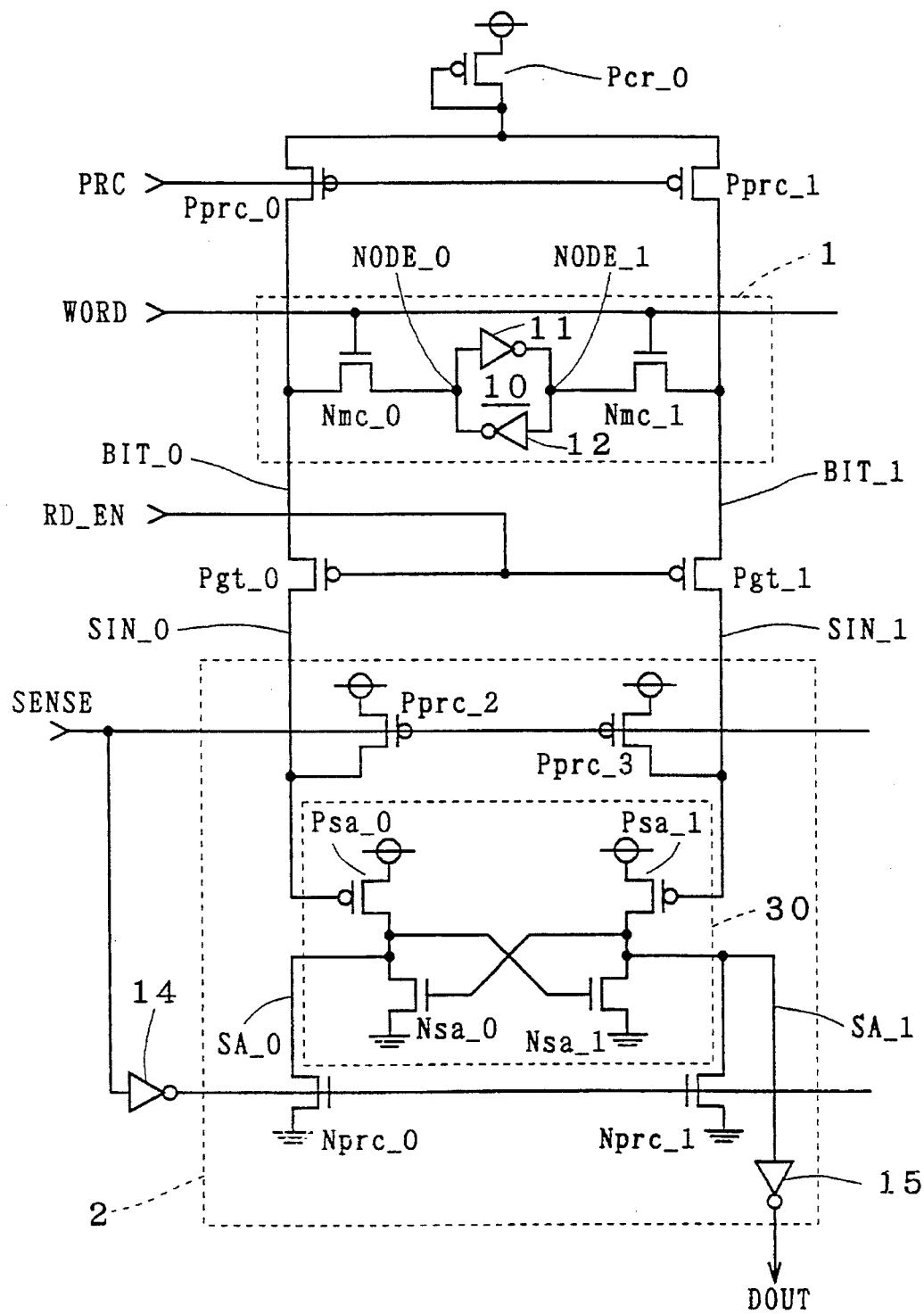
FIG. 2 is a circuit diagram showing a read circuit for the SRAM of FIG. 1 and its adjacent components.
Figure 3:
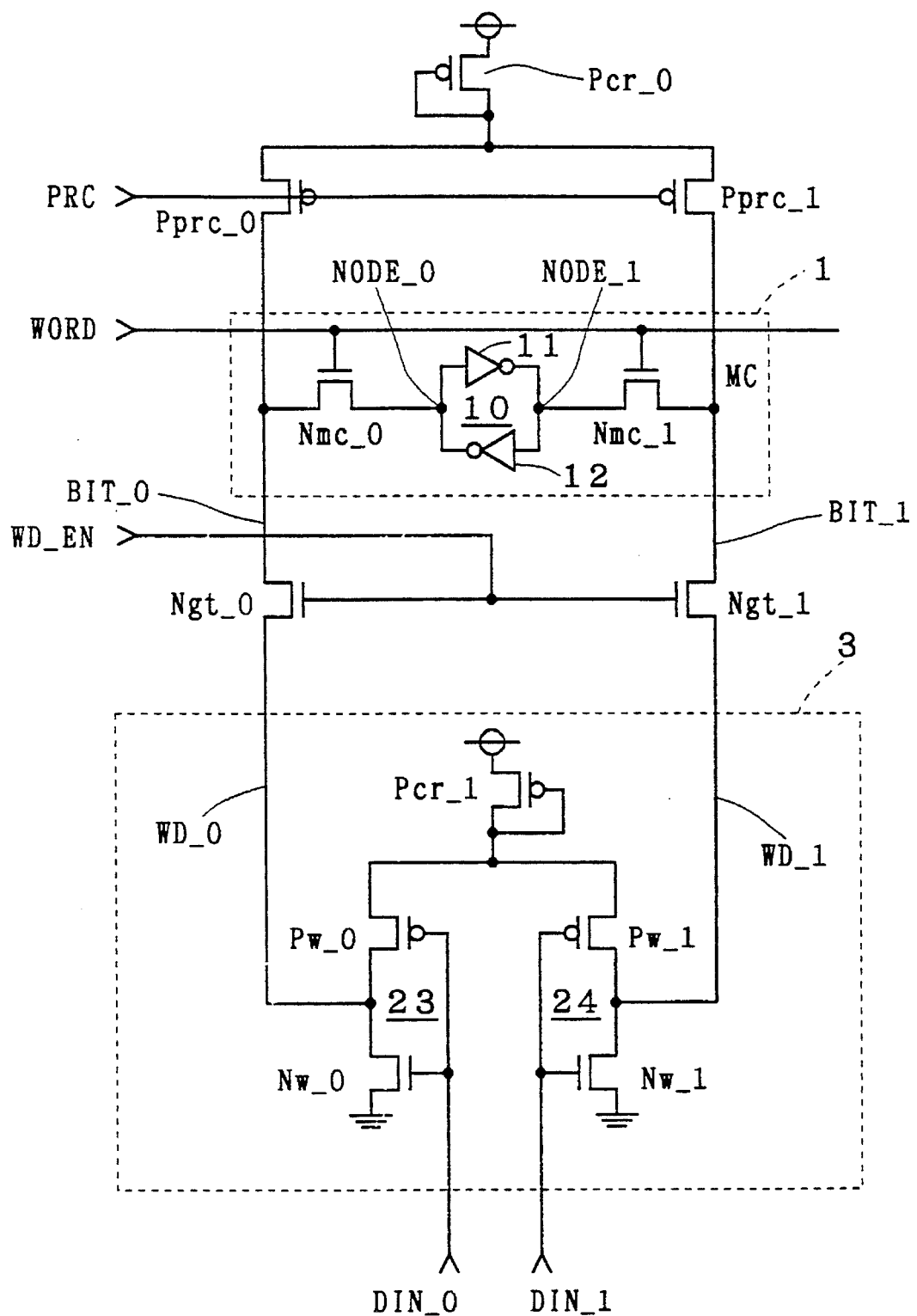
FIG. 3 is a circuit diagram showing a write circuit for the SRAM of FIG. 1 and its adjacent components.

FIG. 1 illustrates an SRAM according to one preferred embodiment of the present invention. FIG. 2 is a circuit diagram showing a read circuit for the SRAM of FIG. 1 and its adjacent components. FIG. 3 is a circuit diagram showing a write circuit for the SRAM of FIG. 1 and its adjacent components. For the purpose of illustration, a read circuit 2 and a write circuit 3 are shown as provided for one memory cell portion 1 in FIGS. 1 to 3. In practice, memory cells are arranged in the form of a matrix with rows each connected to a word line and columns each connected to a pair of bit lines.

Referring to FIG. 1, the memory cell portion 1 is connected between a pair of bit lines BIT_0 and BIT_1 which in turn are connected to the drain (gate) of a clamping transistor Pcr_0 through PMOS transistors Pprc_0 and Pprc_1, respectively. The clamping transistor Pcr_0 and the PMOS transistors Pprc_0, Pprc_1 form a precharge means. The clamping transistor Pcr_0 has a source connected to a power supply, and the drain and gate commonly connected. A precharge signal PRC is applied to the gates of the PMOS transistors Pprc_0 and Pprc_1.

The clamping transistor Pcr_0 has a threshold voltage Vthp. When the precharge signal PRC is "L", the PMOS transistors Pprc_0 and Pprc_1 are conducting, and the clamping transistor Pcr_0 drops the power supply potential VDD by the amount of the threshold voltage Vthp. The pair of bit lines BIT_0 and BIT_1 are precharged at (VDD–|Vthp|) (precharge potential).

The pair of bit lines BIT_0 and BIT_1 are respectively connected to a pair of read input lines SIN_0 and SIN_1 through gate transistors Pgt_0 and Pgt_1. The read circuit 2 is connected to the pair of read input lines SIN_0 and SIN_1. A read bit line selection signal RD_EN is applied to the gates of the gate transistors Pgt_0 and Pgt_1.

The pair of bit lines BIT_0 and BIT_i are respectively connected to a pair of write input lines WD_0 and WD_1 through gate transistors Ngt_0 and Ngt_1. The write circuit 3 is connected to the pair of write input lines WD_0 and WD_1. A write bit line selection signal WR_EN is applied to the gates of the gate transistors Ngt_0 and Ngt_1.

Referring to FIG. 2 (FIG. 3), the memory cell portion 1 includes a memory cell 10 and NMOS access transistors Nmc_0 and Nmc_1. The memory cell 10 includes inverters 11 and 12 which establish a loop connection. A node NODE_0 at the output of the inverter 12 is connected to the bit line BIT_0 through the access transistor Nmc_0, and a node NODE_1 at the output of the inverter 11 is connected to the bit line BIT_1 through the access transistor Nmc_1. A word line WORD is connected to the gates of the access transistors Nmc_0 and Nmc_1. The access transistors Nmc_0 and Nmc_1 have a threshold voltage Vthn which is generally equal to the absolute value |Vthp| of the threshold voltage Vthp.

As shown in FIG. 2, the read circuit 2 includes PMOS transistors Psa_0 and Psa_1 having gates connected respectively to the read input lines SIN_0 and SIN_1, and sources connected commonly to a power supply. An NMOS transistor Nsa_0 has a drain connected to the drain of the PMOS transistor Psa_0, a gate connected to the drain of the PMOS transistor Psa_1, and a source grounded. An NMOS transistor Nsa_1 has a drain connected to the drain of the PMOS transistor Psa_1, a gate connected to the drain of the PMOS transistor Psa_0, and a source grounded. The PMOS transistors Psa_0 and Psa_1 have the threshold voltage Vthp identical with that of the clamping transistor Pcr_0, and the NMOS transistors Nsa_0 and Nsa_1 have the threshold voltage Vthn.

The drain of a PMOS transistor Pprc_2 is connected to the read input line SIN_0, and the drain of a PMOS transistor Pprc_3 is connected to the read input line SIN_1. The sources of the PMOS transistors Pprc_2 and Pprc_3 are connected commonly to a power supply, and the gates thereof receive a sense signal SENSE.

The drains of the PMOS transistors Psa_0 and Psa_1 are connected respectively to the drains of NMOS transistors Nprc_0 and Nprc_1. The sources of the NMOS transistors Nprc_0 and Nprc_1 are grounded, and the gates thereof receive the sense signal SENSE through an inverter 14.

The signals from the drains of the PMOS transistors Psa_0 and Psa_1 are applied to read output lines SA_0 and SA_1. The signal on the read output line SA_1 is outputted as output data DOUT to the exterior through an inverter 15.

In the read circuit 2 having such a construction, when the sense signal SENSE is "H", the PMOS transistors Pprc_2 and Pprc_3 and the NMOS transistors Nprc_0 and Nprc_1 are non-conducting, and a sense amplifier 30 including the read PMOS transistors Psa_0 and Psa_1 and NMOS transistors Nsa,0 and Nsa_1 is active to amplify the potential difference between the pair of read input lines SIN_0 and SIN_1 to output the amplified potential difference to the read output lines SA_0 and SA_1.

The sense amplifier 30 is designed such that the current driving capability of the PMOS transistors Psa_0 and Psa_1 is sufficiently greater than that of the NMOS transistors Nsa_0 and Nsa_1. The sense amplifier 30 is accomplished by a relatively simple circuit arrangement comprised of four transistors: the read PMOS transistors Psa_0 and Psa_1 and NMOS transistors Nsa_0 and Nsa_1. Thus, the degree of integration is not lowered by the provision of the read circuit 2.

Referring to FIG. 3, the write circuit 3 includes a PMOS transistor Pw_0 and an NMOS transistor Nw_0 which have drains connected commonly to the write input line WD_0 and gates receiving input data DIN_0. The write circuit 3 further includes a PMOS transistor Pw_1 and an NMOS transistor Nw_1 which have drains connected commonly to the write input line WD_1 and gates receiving input data DIN_1.

The sources of the PMOS transistors Pw_0 and Pw_1 are connected to the drain (gate) of a clamping transistor Pcr_1. The clamping transistor Pcr_1 has a source connected to a power supply, and the gate and drain connected commonly. The sources of the NMOS transistors Nw_0 and Nw_1 are grounded.

In this manner, the PMOS transistor Pw_0 and NMOS transistor Nw_0 form an inverter 23, and the PMOS transistor Pw_1 and NMOS transistor Nw_1 form an inverter 24.

The clamping transistor Pcr_1 has the threshold voltage Vthp of the same value as that of the clamping transistor Pcr_0. Thus, the inverters 23 and 24 are responsive to the input data DIN_0 and DIN_1 to output signals which are "H" at the precharge potential (VDD–Vthp|) and "L" at the ground level to the pair of write input lines WD_0 and WD_1, respectively.

<Read Operation>

Figure 4:
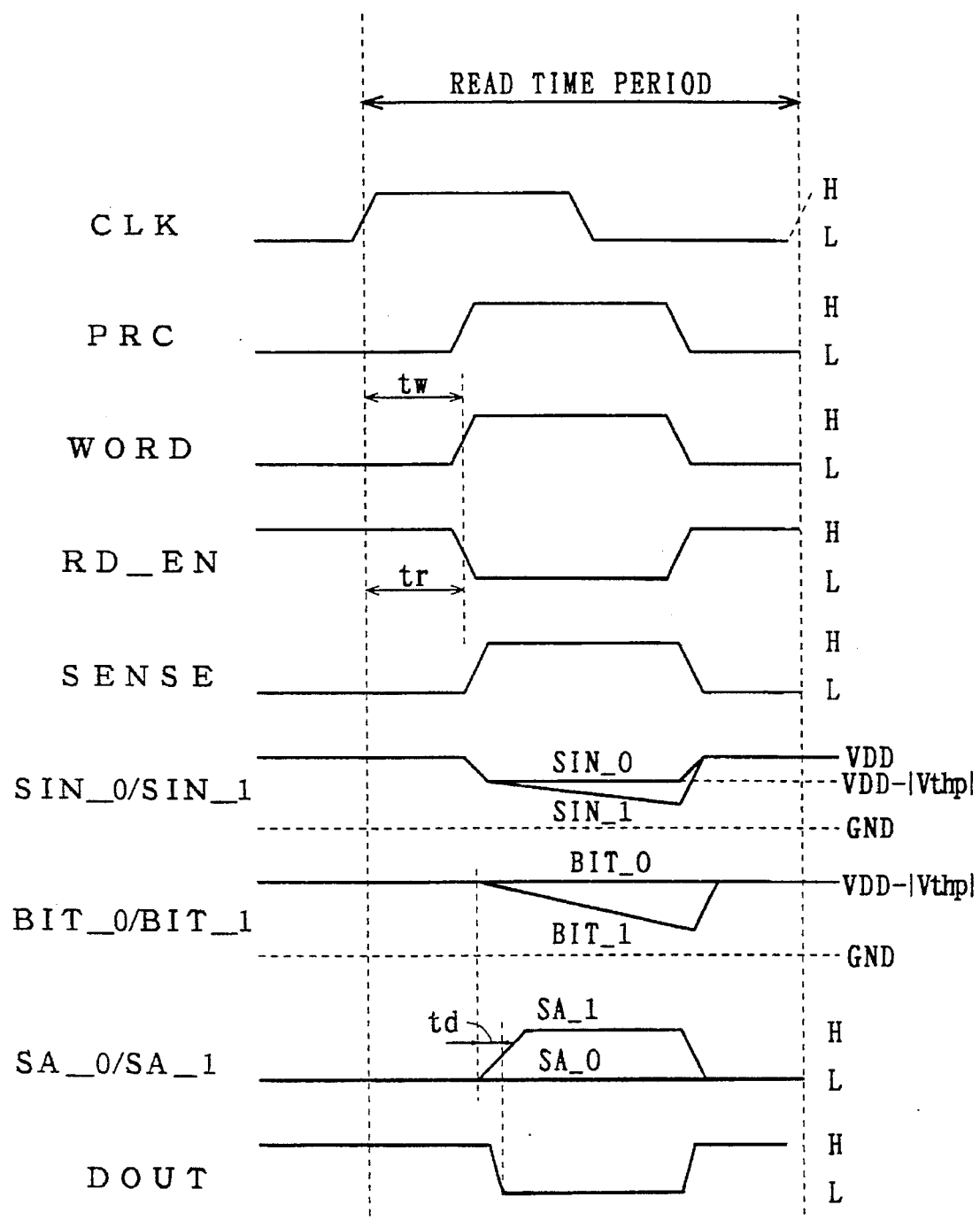
FIGS. 4 and 5 are timing charts showing the read operation of the SRAM of the preferred embodiment.

FIG. 4 is a timing chart illustrating the operation of the SRAM during a read time period according to the preferred embodiment shown in FIGS. 1 to 3. The read operation from the memory cell portion 1 of the SRAM of the preferred embodiment shown in FIGS. 1 to 3 is described below with reference to FIG. 4. In the following description, a power supply potential VDD is represented by "H", and a ground potential GND is represented by "L". In FIG. 4, the abscissa is time, and the ordinate is potential.

The time period other than the read and write time periods is set to a precharge time period over which the precharge signal PRC is set to "L" and the sense signal SENSE is set to "L".

During the precharge time period, since the PMOS transistor Pprc_0 to Pprc_3 and NMOS transistors Nprc_0, Nprc_1 are conducting, the clamping transistor Pcr_0 sets the pair of bit lines BIT_0 and BIT_1 to the precharge potential (VDD–|Vthp|), and the pair of read input lines SIN_0 and SIN_1 are set to "H" while the pair of read output lines SA_0 and SA_1 are set to "L".

The read operation starts at the rising edge of a clock signal CLK to "H". The word line WORD rises to "H" at a time later by the amount of time tw than the rising edge of the clock signal CLK (word line selecting state). The read bit line selection signal RD_EN falls at a time later by the amount of time tr (substantially equal to the time tw) than the rising edge of the clock signal CLK. The delays of times tw and tr are required for a row decoder and a column decoder (both not shown) for controlling word lines and bit lines to decode a row address signal or a column address signal to select a desired word line or bit line.

With the word line WORD at "H", the access transistors Nmc_0 and Nmc_1 are conducting, and the nodes. NODE_0 and NODE_1 of the memory cell 10 are respectively electrically connected to the bit lines BIT_0 and BIT_1. With the read bit line selection signal RD_EN at "L", the gate transistors Pgt_0 and Pgt_1 are conducting, and the pair of bit lines BIT_0 and BIT_1 are respectively electrically connected to the pair of read input lines SIN_0 and SIN_ of the read circuit 2 (bit line selecting state). It should be noted that all write bit line selection signals WR_EN are fixed to "L" during the read time period.

It is assumed that the node NODE_0 at the output of the inverter 12 is "H" and the node NODE_1 at the output of the inverter 11 is "L" in the memory cell 10.

In this case, current flows from the bit line BIT_1 to the node NODE_1 through the access transistor Nmc_1 of the memory cell portion 1. Then the potential of the bit line BIT_1 starts falling from the precharge potential (VDD–|Vthp|). For the bit line BIT_0, the gate-source potential difference of the access transistor Nmc_0 is |Vthp| since the potential at the node NODE_0 is the power supply potential VDD and the potential of the bit line BIT_0 is (VDD–|Vthp|).

At this time, the threshold voltage Vthn of the access transistor Nmc_0 is substantially equal to |Vthp|, and little current flows to the access transistor Nmc_0 due to the backgate effect. This permits the bit line BIT_0 to maintain the initial precharge potential. The sense signal SENSE is set to rise substantially simultaneously with the falling edge of the read bit line selection signal RD_EN, and the sense amplifier 30 in the read circuit 2 is activated.

Upon activation of the sense amplifier 30, the potentials of the pair of read input lines SIN_0 and SIN_1 which have been precharged at the power supply potential VDD rapidly fall to the precharge potential (VDD−|Vthp|) of the pair of bit lines BIT_0 and BIT_1. Hence the potentials of the pair of read input lines SIN_0 and SIN_1 are rapidly set to a boundary potential between conduction and non-conduction of the gate potentials of the PMOS transistors Psa_0 and Psa_1 at the input stage of the sense amplifier 30 after the start of operation of the sense amplifier 30.

Then the potential of the read input line SIN_1 of the pair of read input lines SIN_0 and SIN_1 further falls from (VDD−|Vthp|). This places the PMOS transistor Psa_1 into conduction, causing current to flow through the transistor Psa_1.

When the transistor Psa_1 conducts, the potential of the read output line SA_1 rises to cause the NMOS transistor Nsa_0 to conduct, thereby fixing the potential of the read output line SA_0 to "L". This state is fed back and the NMOS transistor Nsa_1 remains non-conducting, permitting the potential of the read output line SA_1 to continue rising up to the power supply potential VDD.

Figure 5:
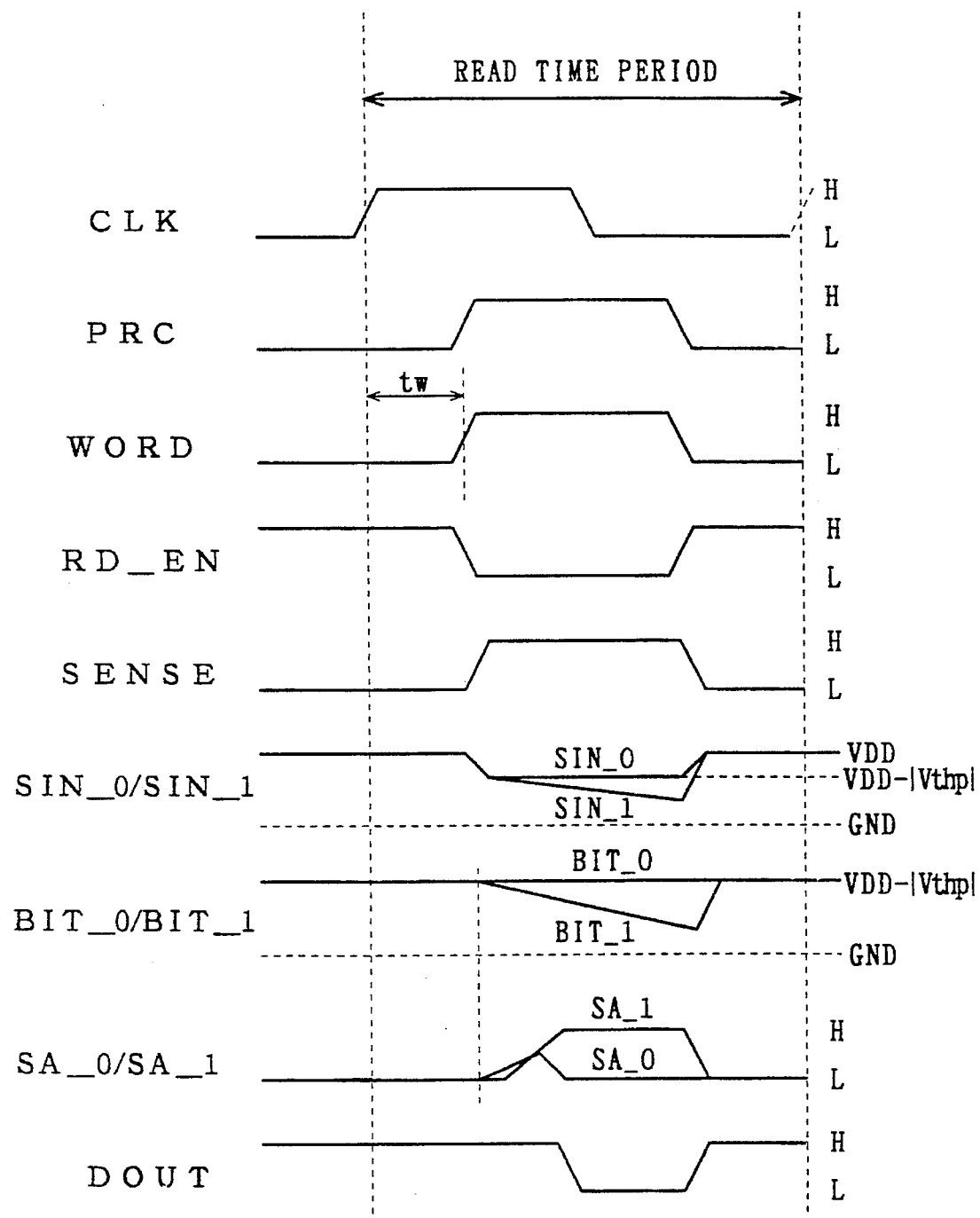

Assuming that the PMOS transistors Psa_0 and Psa_1 have unbalanced transistor performances and the absolute value of the threshold voltage of the PMOS transistor Psa_0 is slightly less than the absolute value of the threshold voltage of the PMOS transistor Psa_1, current flows first through the PMOS transistor Psa_0 immediately after the activation of the sense amplifier 30 as shown in FIG. 5, and the NMOS transistor Nsa_1 conducts lightly to raise the potential of the read output line SA_0 to some degree.

However, since the current driving capability of the PMOS transistors Psa_0 and Psa_1 is sufficiently greater than that of the NMOS transistors Nsa_O and Nsa_1, as the PMOS transistor Psa_1 conducts more heavily in accordance with the potential drop of the bit line BIT_1 (read input line SIN_1), the amount of current fed to the PMOS transistor Psa_1 exceeds the amount of current fed to the NMOS transistor Nsa_1 without fail, and the potential of the read output line SA0 starts falling to "L" again as shown in FIG. 5. A complementary operation to the initial misjudgment functions to raise the potential of the read output line SA_1 to "H". As a result, the sense amplifier 30 outputs the correct output data DOUT ("L").

The difference between the unbalanced threshold voltages of the PMOS transistors Psa_0 and Psa_1 is of the order, at most, of some millivolts and, accordingly, a negligibly short time is required for complementary operation to the initial misjudgment.

The read time period T1 between the start of the read operation of the SRAM of the preferred embodiment and the provision of the output data DOUT is expressed as:

$$T1 = tw + td \quad (2)$$

where tw is a time interval between the rising edge of the clock signal CLK and the rising edge of the word line WORD, and td is a time interval between the development of the potential difference between the pair of bit lines and the determination of the output data DOUT by sufficient amplification of the pair of read output lines SA_0 and SA_1 by the sense amplifier 30.

From the comparison with the read time period T0 (Equation (I)) of the conventional SRAM, it is apparent that (tb1+tb2)>td. The speeding up of the read operation is achieved by eliminating the wait time between the activation of the word line WORD and the activation of the sense amplifier 30.

The address line is inactivated simultaneously with the falling edge of the clock signal CLK, and the word line WORD and the bit line selection signal RD_EN are inactivated slightly later. The sense signal SENSE falls in response to the inactivation of the bit line selection signal RD_EN to inactivate the sense amplifier 30 in the read circuit 2.

After the end of the read time period, the precharge time period starts again during which the pair of read output lines SA_0 and SA_1 of the sense amplifier 30 are predischarged to the ground potential by the NMOS transistors Nprc_0 and Nprc_1.

Thus, if the read output line SA_0 or SA_1 in the initial state starts being charged by mistake due to the unbalanced transistor performances in the sense, amplifier 30 during the read operation, the potential of the output line SA_0 or SA_1 rises only slightly from the ground potential, and the above described complementary operation functions, insuring the provision of the correct output data DOUT. In this preferred embodiment, the time period over which the potentials of the pair of read output lines SA_0 and SA_1 are set to the ground level (first potential setting time period) coincides with the precharge time period. However, the first potential setting time period should not necessarily coincide with the precharge time period but may be set to a predetermined time period prior to the read time period.

Further, setting of the gate potentials of the NMOS transistors Nsa_0 and Nsa_1 to the ground potential allows the NMOS transistors Nsa_0 and Nsa_1 to reach the non-conducting state without fail immediately after the read operation.

Consequently, the NMOS transistors Nsa_0 and Nsa_1 at the start of the read time period are prevented from being placed into the conducting state by mistake, achieving the correct read operation.

Additionally, since the PMOS transistors Pprc_2 and Pprc_3 precharge the pair of read input lines SIN_0 and SIN_1 at the power supply potential VDD, the PMOS transistors Ps_0 and Psa_1 at the input stage of the sense amplifier 30 are reliably in the non-conducting state during the time period other than the read time period, and a slight leakage current (sub-threshold current) is prevented from flowing through the PMOS transistors Psa_0 and Psa_1, achieving low power consumption. In this preferred embodiment, the time period over which the potentials of the pair of read input lines SIN_0 and SIN_1 are set to the power supply potential VDD (second potential setting time period) coincides with the precharge time period of the pair of bit lines BIT_0 and BIT_1. However, the second potential setting time period should not necessarily coincide with the precharge time period but may be set to a predetermined time period prior to the read time period.

<Write Operation>

Figure 6:
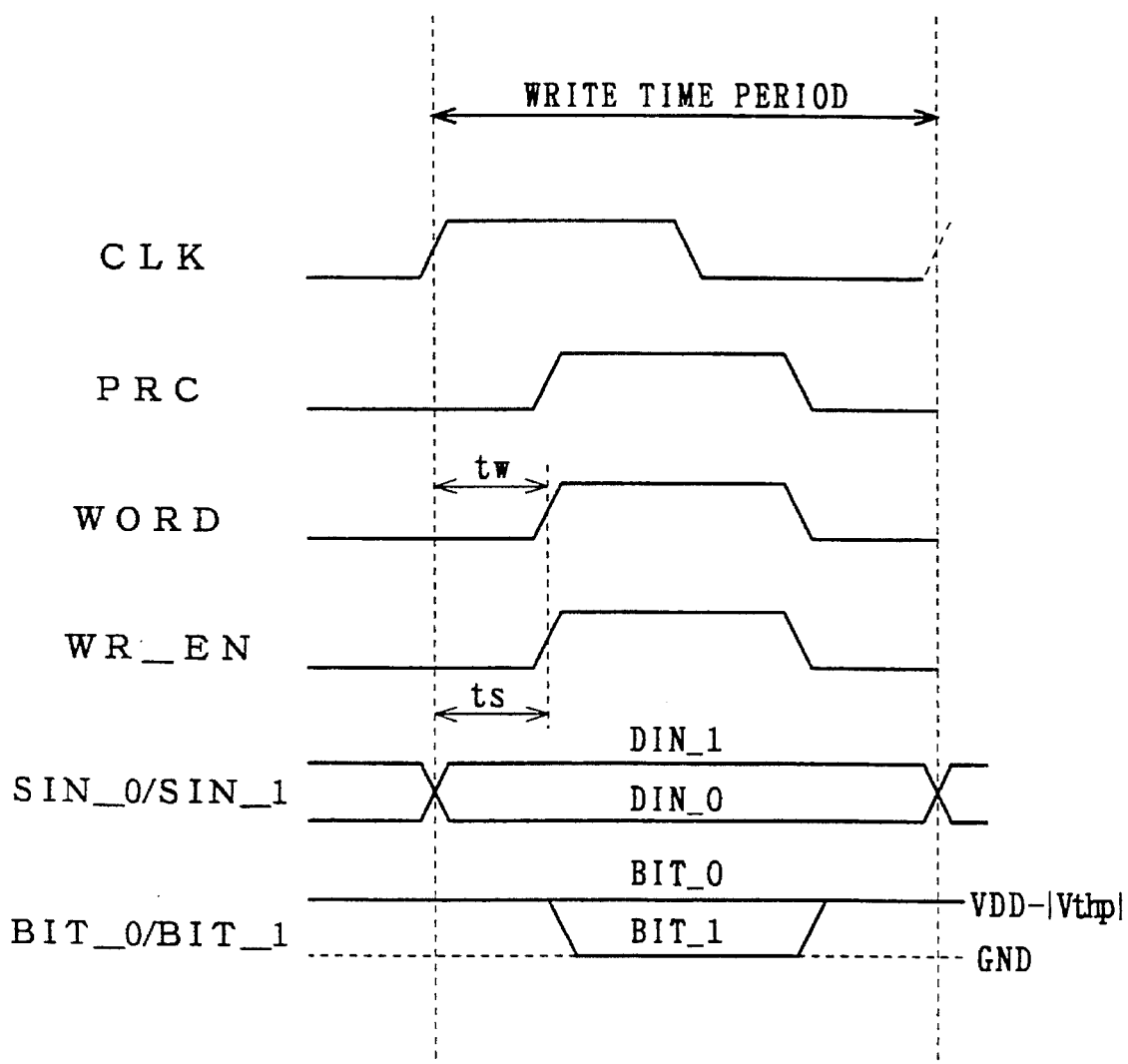
FIG. 6 is a timing chart showing the write operation of the SRAM of the preferred embodiment.
Figure 7:
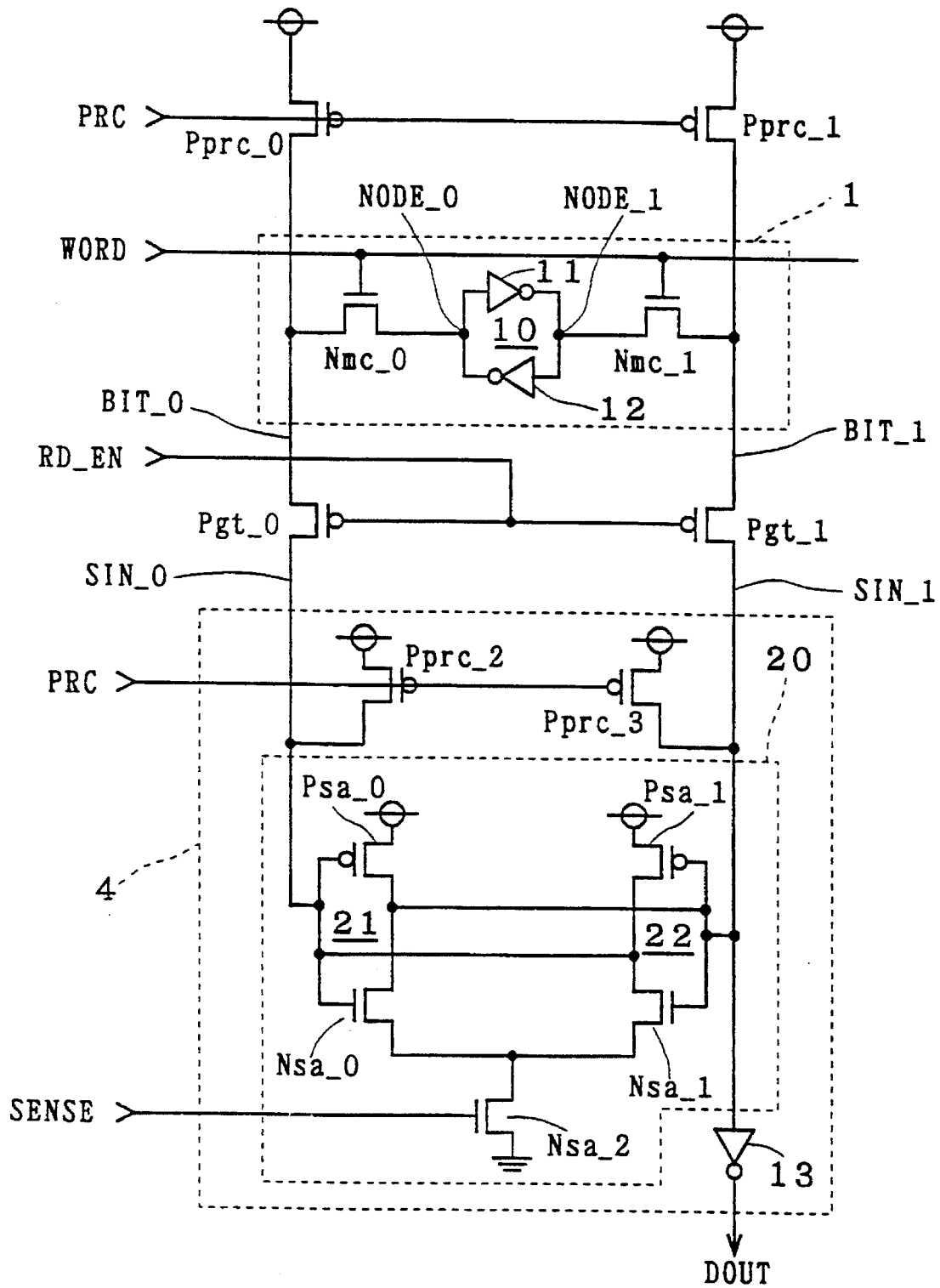
FIG. 7 illustrates a conventional SRAM.
Figure 8:
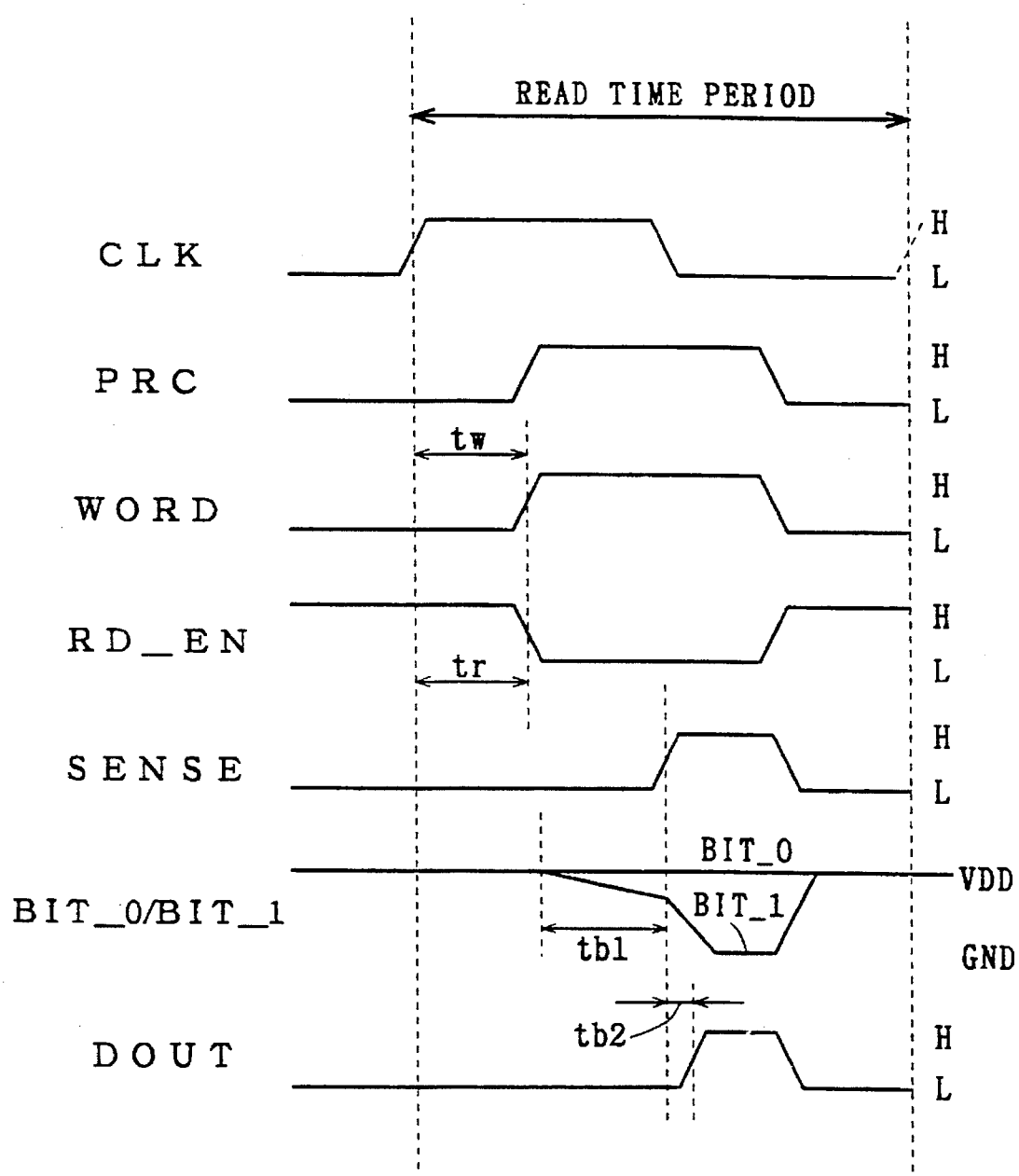
FIG. 8 is a timing chart showing the read operation of the conventional SRAM.

FIG. 6 is a timing chart illustrating the operation of the SRAM during a write time period according to the preferred embodiment shown in FIGS. 1 to 3. The write operation to the memory cell portion 1 of the SRAM of the preferred embodiment shown in FIGS. 1 to 3 is described with reference to FIG. 6. In FIG. 6, the abscissa is time, and the ordinate is potential.

As above stated, the time period other than the read and write time periods is set to the precharge time period over which the clamping transistor Pcr_0 sets the pair of bit lines BIT_0 and BIT_1 at the precharge potential (VDD–|Vthp|).

The write operation, like the read operation, starts at the rising edge of the clock signal CLK to "H". The word line WORD rises to "H" at a time later by the amount of time tw than the rising edge of the clock signal CLK (word line selecting state). The write bit line selection signal WR_EN rises to "H" at a time, later by the amount of time ts than the rising edge of the clock signal CLK.

With the word line WORD at "H", the access transistors Nmc_0 and Nmc_1 are conducting, and the nodes NODE_0 and NODE_1 of the memory cell 10 are respectively electrically connected to the bit lines BIT_0 and BIT_1. With the write bit line selection signal WR_EN at "H", the gate transistors Ngt_0 and Ngt_1 are conducting, and the pair of bit lines BIT_0 and BIT_1 are respectively electrically connected to the pair of write input lines WD_0 and WD_1 of the write, circuit 3 (bit line selecting state).

In general, whether a cycle is for the write or read operation is determined by a control signal for that purpose (not shown in FIG. 6). During the write operation, all bit line selection signals RD_EN are fixed to "H".

Until the bit line is selected, the precharge signal PRC is "L" and the potentials of the pair of bit lines BIT_0 and BIT_1 are precharged by the clamping transistor Pcr_0 and PMOS transistors Pprc_0 and Pprc_1 and are held at (VDD–|Vthp|).

It is assumed that the memory cell 10 is written so that the node NODE_0 becomes "H" and the node NODE_1 becomes "L". For this purpose, "L" is applied to the input data DIN_0 and "H" is applied to the input data DIN_1. This allows the potential of the write input line WD_0 of the write circuit 3 to be clamped by the clamping transistor Pcr_1 and set to (VDD–|Vthp|), and allows the potential of the write input line WD_1 to be set to the ground potential.

The potentials of the pair of write input lines WD_0 and WD_1 are propagated to the pair of bit lines BIT_0 and BIT_1 through the conducting gate transistors Ngt_0 and Ngt_1. The potential of the bit line BIT_1 is discharged through the NMOS transistor Nw_1 of the write circuit 3 to reach the ground potential. The potential of the bit line BIT_0 which has been (VDD–|Vthp|) during the precharge time period and equals the potential of the write input line WD_0, is not changed.

As a result, the bit line BIT_1 is at the ground potential and the potential at the node NODE_1 falls to the ground potential through the transistor Nmc_1 of the memory cell portion 1. On the other hand, the potential at the node NODE_0 is dropped to (VDD–|Vthp|) through the access transistor Nmc_0. Since memory cell 10 includes the loop arrangement of the two inverters 11 and 12, the potential at the node NODE_0 is fed back and then rises to the power supply potential. The write operation to the memory cell 10 is terminated.

In this manner, the write circuit 3 of the preferred embodiment reduces the write high level to the precharge potential (VDD–|Vthp|) for write operation to prevent the potentials of the pair of bit lines BIT_0 and BIT_1 from exceeding the, precharge potential (VDD–|Vthp|) immediately after the write operation.

Therefore, the clamping transistor Pcr_0 can correctly set the potentials of the pair of bit lines BIT_0 and BIT_1 to the precharge potential (VDD–|Vthp|) within the precharge time period when the write operation, precharge operation, and read operation are successively performed.

Consequently, the read operation which follows the write operation is performed without malfunction.

It is assumed that the above stated write operation is performed when the write circuit 3 includes no clamping transistor Pcr_1 and the high level is set to the power supply potential VDD. In this case, the node NODE_0 for the bit line BIT_0 of the memory cell 10 is written with "H", and the potential of the bit line BIT_0 rises up to the power supply potential VDD.

Then the precharge operation causes the potential of the bit line BIT_1 from the ground potential to (VDD–|Vthp|) when the read operation follows the write operation. On the other hand, the bit line BIT_0 which has the potential raised to the power supply potential VDD during the write operation holds its potential.

When the read operation is executed in the next cycle, conduction of the PMOS transistor Psa_0 at the input stage of the sense amplifier 30 of the read circuit 2 further requires a threshold reduction time for reducing the potential of the bit line BIT_0 from its initial value VDD by the amount of |Vthp|.

Further, if variations in transistor performance cause a leakage current in the NMOS transistor Nsa_0 and PMOS transistor Psa_1 on opposite sides, the potential of the read output line SA_1 rises during the extra time required, which might result in conduction of the NMOS transistor Nsa_0 by mistake. In such a case, the complementary operation is made by the conduction of the PMOS transistor Psa_0. However, the conduction of the PMOS transistor Psa_0 at a time later by the amount of threshold reduction time requires a further prolonged time to set the read output line SA_0 to "H".

In this manner, the provision of the clamping transistor Pcr_1 in the write circuit 3 and setting of the high level to the precharge potential (VDD–|Vthp|) are essential for correct read operation which follows the write operation.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory comprising:

first and second power supplies for supplying first and second power supply voltages, respectively;

a pair of first and second bit lines;

a memory cell portion having first and second storage nodes for causing potentials at said first and second storage nodes to feed said first and second power supply voltages, respectively, on the basis of contents of storage;

precharge means for setting the potentials of said first and second bit lines to a precharge potential during a precharge time period;

memory cell portion connecting means for electrically connecting said first and second storage nodes of said memory cell portion and said pair of first and second bit lines, respectively, during a write time period or during a read time period which follows said precharge time period;

read means for providing output data to the exterior during the read time period in response to a potential difference between first and second bit line potentials respectively appearing on said first and second bit lines; and write means for developing a potential difference between said first and second bit lines during the write time period in response to external input data, said potential difference permitting the contents of storage in said memory cell portion to be rewritten, said precharge means including a clamping transistor of a first conductivity type having a first electrode connected to said first power supply and control and second electrodes connected commonly, said clamping transistor having a first threshold voltage for shifting said first power supply voltage at its first electrode toward said second power supply voltage by the amount of said first threshold voltage to provide said precharge potential, said read means including first and second read transistors of the first conductivity type having said first threshold voltage and receiving said first and second bit line potentials at their control electrodes during said read time period, respectively, each of said first and second read transistors having a first electrode, connected to said first power supply, each of said first and second read transistors being conducting when a potential difference between the control electrode and first electrode thereof is greater than said first threshold voltage and being non-conducting when the potential difference is less than said first threshold voltage, thereby determining said output data depending on the conduction/non-conduction thereof, said write means setting one of said pair of first and second bit lines to said precharge potential and the other bit line to said second power supply voltage in response to said input data.

2. The semiconductor memory of claim 1, wherein said read means further includes:
- a third read transistor of a second conductivity type having a first electrode connected to said second power supply, a second electrode connected to a second electrode of said first read transistor, and a control electrode connected to a second electrode of said second read transistor, said third read transistor having a second threshold voltage; and
- a fourth read transistor of the second conductivity type having a first electrode connected to said second power supply, a second electrode connected to said second electrode of said second read transistor, and a control electrode connected to said second electrode of said first read transistor, said fourth read transistor having said second threshold voltage, each of said third and fourth read transistors being conducting when a potential difference between the control electrode and first electrode thereof is greater than said second threshold voltage and being non-conducting when the potential difference is less than said second threshold voltage, and wherein said first to fourth read transistors form a sense amplifier for providing output data, the output data from said sense amplifier being provided at said second electrode of at least one of said third and fourth read transistors.

3. The semiconductor memory of claim 1, wherein said input data includes first and second partial input data which are in logically inverted relationship, and wherein said write means includes:
- a second clamping transistor of the first conductivity type having a first electrode connected to said first power supply, and second and control electrodes connected commonly;
- a first write transistor of the first conductivity type having a first electrode connected to said second electrode of said second clamping transistor, a second electrode, and a control electrode receiving said first partial input data;
- a second write transistor of the first conductivity type having a first electrode connected to said second electrode of said second clamping transistor, a second electrode, and a control electrode receiving said second partial input data;
- a third write transistor of a second conductivity type having a first electrode connected to said second power supply, a second electrode connected to said second electrode of said first write transistor, and a control electrode receiving said first partial input data;
- a fourth write transistor of the second conductivity type having a first electrode connected to said second power supply, a second electrode connected to said second electrode of said second write transistor, and a control electrode receiving said second partial input data, said first bit line potential being set in response to a signal provided at a connecting point of said second electrodes of said first and third write transistors during the write time period, said second bit line potential being set in response to a signal provided at a connecting point of said second electrodes of said second and fourth write transistors during the write time period.

4. The semiconductor memory of claim 2, wherein said read means further includes
first potential setting means connected to said second power supply for setting the potentials of said second electrodes of said third and fourth read transistors to said second power supply voltage during a first potential setting time period prior to said read time period.

5. The semiconductor memory of claim 4, wherein said first potential setting means includes:
- a first potential setting transistor of the second conductivity type having a first electrode connected to said second power supply, and a second electrode connected to said second electrodes of said first and third read transistors;
- a second potential setting transistor of the second conductivity type having a first electrode connected to said second power supply, and a second electrode connected to said second electrodes of said second and fourth read transistors; and
- first transistor control means for placing said first and second potential setting transistors into conduction during said first potential setting time period and placing said first and second potential setting transistors into non-conduction during said read time period.

6. The semiconductor memory of claim 2, wherein the current driving capability of said first read transistor is greater than that of said third read transistor, and the current driving capability of said second read transistor is greater than that of said fourth read transistor.

7. The semiconductor memory of claim 2, wherein said read means further includes
second potential setting means connected to said first power supply for setting the potentials of said control electrodes of said first and second read transistors to said first power supply voltage during a second potential setting time period other than said read time period.

8. The semiconductor memory of claim 7, wherein said second potential setting means includes:
- a third potential setting transistor of the first conductivity type having a first electrode connected to said first power supply, and a second electrode connected to said control electrode of said first read transistor;
- a fourth potential setting transistor of the first conductivity type having a first electrode connected to said first power supply, and a second electrode connected to said control electrode of said second read transistor; and
- second transistor control means for placing said third and fourth potential setting transistors into conduction during said second potential setting time period and placing said third and fourth potential setting transistors into non-conduction during said read time period.

9. The semiconductor memory of claim 8, wherein said first potential setting time period and said second potential setting time period are identical with said precharge time period.

10. The semiconductor memory of claim 7, wherein said first conductivity type is a P type, and said second conductivity type is an N type, and wherein said first power supply voltage is higher than said second power supply voltage.

11. The semiconductor memory of claim 10, wherein said clamping transistor and said first to fourth read transistors are MOS transistors, each of said first electrodes thereof being a source electrode, each of said second electrodes thereof being a drain electrode.

12. The semiconductor memory of claim 7, wherein said pair of bit lines includes a plurality of pairs of bit lines, and said memory cell portion includes a plurality of memory cell portions, and wherein some of said plurality of memory cell portions in predetermined number are provided in corresponding relation to each of said plurality of pairs of bit lines.

13. The semiconductor memory of claim 12, wherein said memory cell portion connecting means includes
- memory cell portion selecting means for selecting one of said predetermined number of memory cell portions provided in corresponding relation to each of said plurality of pairs of bit lines to electrically connect said first and second storage nodes of said selected memory cell portion and the corresponding pair of first and second bit lines.

* * * * *